US005543746A

United States Patent [19]

Kuo

[11] Patent Number: 5,543,746

[45] Date of Patent: Aug. 6, 1996

[54] PROGRAMMABLE CMOS CURRENT SOURCE HAVING POSITIVE TEMPERATURE COEFFICIENT

[75] Inventor: James R. Kuo, Cupertino, Calif.

[73] Assignee: National Semiconductor Corp., Santa Clara, Calif.

[21] Appl. No.: 524,116

[22] Filed: Aug. 22, 1995

Related U.S. Application Data

[63] Continuation of Ser. No. 73,939, Jun. 8, 1993, abandoned.

[51] Int. Cl.[6] .............................. G05F 1/10; G06G 7/12; H03B 1/00

[52] U.S. Cl. .......................... 327/543; 327/362; 327/108

[58] Field of Search .................................... 307/310, 491, 307/580, 296.8, 264, 270; 328/3, 172; 327/512, 513, 362, 427, 543, 306, 108, 262

[56] References Cited

U.S. PATENT DOCUMENTS

| | | | |
|---|---|---|---|
| 3,333,113 | 7/1967 | Cole et al. | 307/88.5 |
| 3,899,754 | 8/1975 | Brolin | 332/11 |
| 4,254,501 | 3/1981 | Griffith et al. | 375/9 |
| 4,385,394 | 5/1983 | Pace | 375/36 |

(List continued on next page.)

FOREIGN PATENT DOCUMENTS

| | | | |
|---|---|---|---|
| 0199374 | 10/1986 | European Pat. Off. | H03K 19/094 |
| 0351820A2 | 7/1989 | European Pat. Off. | |
| 0504983A1 | 3/1992 | European Pat. Off. | |
| 0557080A1 | 8/1993 | European Pat. Off. | |
| 0575676A1 | 12/1993 | European Pat. Off. | |
| WO85/02507 | 6/1985 | WIPO | H03K 19/092 |
| WO85/04774 | 10/1985 | WIPO | H03K 19/086 |
| WO86/01055 | 2/1986 | WIPO | H03K 19/092 |
| WO89/00362 | 1/1989 | WIPO | |
| WO91/20129 | 12/1991 | WIPO | |

OTHER PUBLICATIONS

Bill Gunning, "GTL Fact Sheet", Sep. 20, 1991, all pages.

Paul R. Gray and Robert G. Meyer, "Analysis and Design of Analog Integrated Circuits", 1977, pp. 254–261.

"Electronically Switchable Interface Circuit With Multiple EIA Protocol Drivers and Receivers", IBM Technical Disclosure Bulletin, vol. 30, No. 11, Apr. 1988, all pages.

Boris Bertolucci, "Fastbus Dual–Port Memory and Display Diagnostic Module", IEEE Transactions on Nuclear Science, vol. NS–34, No. 1, Feb. 1987, pp. 253–257.

National Semiconductor Corporation, "DS36950 Quad Differential Bus Transceiver", Interface Databook, 1990 Edition, pp. 1–123 to 1–131.

(List continued on next page.)

*Primary Examiner*—William L. Sikes
*Assistant Examiner*—Tiep H. Nguyen
*Attorney, Agent, or Firm*—Limbach & Limbach L.L.P.

[57] ABSTRACT

A temperature compensation circuit is disclosed that includes a first field-effect transistor (FET), a second FET, a resistor, and current generating circuitry. The second FET has a larger current conducting channel than the current conducting channel of the first FET, and the gate of the second FET is coupled to the gate of the first FET. The resistor is coupled between a first node that is common with the source of the first FET and a second node that is common with the source of the second FET. The current generating circuitry generates and maintains substantially equal drain currents in the first and second FETs. In an alternative embodiment, a positive temperature coefficient current generation stage that includes a first FET causes a first current conducted by the channel of the first FET to increase when temperature increases and decrease when temperature decreases, and a programmable current transfer and modification stage generates a third current that may be selectively programmed to be any one of a plurality of values that are linearly proportional to the first current conducted by the channel of the first FET.

17 Claims, 5 Drawing Sheets

U.S. PATENT DOCUMENTS

| | | | |
|---|---|---|---|
| 4,393,494 | 7/1983 | Belforte et al. | 370/27 |
| 4,419,594 | 12/1983 | Gemmell | 307/491 |
| 4,588,941 | 5/1986 | Kerth et al. | 323/314 |
| 4,645,948 | 2/1987 | Morris | 307/310 |
| 4,647,912 | 3/1987 | Bates et al. | 340/825.5 |
| 4,723,108 | 2/1988 | Murphy et al. | 323/315 |
| 4,751,404 | 6/1988 | Yuen | 307/297 |
| 4,760,292 | 7/1988 | Bach | 307/475 |
| 4,774,422 | 9/1988 | Donaldson et al. | 307/475 |
| 4,825,402 | 4/1989 | Jalali | 364/900 |
| 4,855,622 | 8/1989 | Johnson | 307/456 |
| 4,855,623 | 8/1989 | Flaherty | 307/491 |
| 4,894,561 | 1/1990 | Nogami | 307/443 |
| 4,922,140 | 5/1990 | Gahle et al. | 307/591 |
| 4,929,941 | 5/1990 | Lecocq | 340/825.14 |
| 4,972,106 | 11/1990 | Ruijs | 307/473 |
| 4,978,905 | 12/1990 | Hoff et al. | 323/314 |
| 4,980,579 | 12/1990 | McDonald et al. | 307/455 |
| 5,015,888 | 5/1991 | Ovens | 307/475 |
| 5,017,813 | 5/1991 | Galbraith et al. | 307/475 |
| 5,019,728 | 5/1991 | Sanwo et al. | 307/475 |
| 5,021,684 | 6/1991 | Ahuja et al. | 307/443 |
| 5,021,691 | 6/1991 | Saito | 307/475 |
| 5,023,487 | 6/1991 | Wellheuser et al. | 307/475 |
| 5,023,488 | 6/1991 | Gunning | 307/475 |
| 5,034,632 | 7/1991 | Jansson et al. | 307/456 |
| 5,041,743 | 8/1991 | Matsumoto | 307/455 |
| 5,070,256 | 12/1991 | Grondalski | 307/270 |
| 5,079,456 | 1/1992 | Kotowski | 307/491 |
| 5,081,380 | 1/1992 | Chen | 307/591 |
| 5,095,231 | 3/1992 | Sartori et al. | 307/475 |
| 5,117,130 | 5/1992 | Shoji | 307/491 |
| 5,118,971 | 6/1992 | Schenck | 307/443 |
| 5,165,046 | 11/1992 | Hesson | 307/270 |
| 5,198,701 | 3/1993 | Davies | 307/310 |
| 5,200,654 | 4/1993 | Archer | 307/310 |
| 5,208,492 | 5/1993 | Masumoto et al. | 307/469 |
| 5,216,292 | 6/1993 | Imazu et al. | 307/443 |
| 5,218,239 | 6/1993 | Boomer | 307/443 |
| 5,231,315 | 7/1993 | Thelen | 307/310 |
| 5,241,221 | 8/1993 | Fletcher et al. | 307/263 |
| 5,254,883 | 10/1993 | Horowitz et al. | 307/443 |
| 5,285,116 | 2/1994 | Thaik | 307/443 |
| 5,287,386 | 2/1994 | Wade et al. | 375/36 |
| 5,291,071 | 3/1994 | Allen et al. | 307/270 |
| 5,293,082 | 3/1994 | Bathaee | 307/270 |
| 5,296,756 | 3/1994 | Patel et al. | 307/443 |
| 5,304,861 | 4/1994 | Fruhauf | 307/310 |
| 5,313,118 | 5/1994 | Lundberg | 307/451 |
| 5,315,174 | 5/1994 | Chang et al. | 307/443 |
| 5,319,258 | 6/1994 | Ruetz | 307/443 |
| 5,329,184 | 7/1994 | Redfern | 307/475 |
| 5,334,882 | 8/1994 | Ting | 307/270 |
| 5,338,987 | 8/1994 | Tomasetti et al. | 307/570 |

OTHER PUBLICATIONS

National Semiconductor Corporation, "DS3886 BTL 9–Bit Latching Data Transceiver", High Performance Bus Interface Designer's Guide, 1991 Edition, pp. 1–74 to 1–80.

National Semiconductor Corporation, "DS3883 BTL 9–Bit Data Transceiver", High Performance Bus Interface Designer's Guide, 1991 Edition, pp. 1–58 to 1–62.

U.S. Ser. No. 08/073,927 U.S. Patent Application of James R. Kuo 6/08/93.

U.S. Ser. No. 08/146,617 U.S. Patent Application of James R. Kuo 11/02/93.

Authored by Phillip E. Allen & Douglas R. Holberg, Entitled "CMOS Analog Circuit Design", 1987, pp. 240–251, published by Holt, Rinehart and Winston, Inc.

| C1 | C2 | VGM70 | VGM72 | VGM74 | VGM76 |
|---|---|---|---|---|---|
| 0 | 0 | 0 | 0 | 0 | 1 |
| 0 | 1 | 0 | 0 | 1 | 0 |
| 1 | 0 | 0 | 1 | 0 | 0 |
| 1 | 1 | 1 | 0 | 0 | 0 |

PROGRAMMABLE CMOS CURRENT SOURCE HAVING POSITIVE TEMPERATURE COEFFICIENT

This is a continuation of application Ser. No. 08/073,939, filed on Jun. 8, 1993, now abandoned.

RELATED APPLICATIONS

This application is related to the following copending applications that were all filed of even date herewith and are commonly assigned with this application to National Semiconductor Corporation of Santa Clara, Calif.: U.S. Ser. No. 08/075,534, titled "CMOS BTL Compatible Bus and Transmission Line Driver" by James Kuo; U.S. Ser. No. 08/073,304, titled "CMOS Bus and Transmission Line Driver Having Compensated Edge Rate Control" by James Kuo; U.S. Ser. No. 08/073,679, titled "Programmable CMOS Bus and Transmission Line Driver" by James Kuo; and, U.S. Ser. No. 08/073,927, titled "Programmable CMOS Bus and Transmission Line Receiver" by James Kuo. The above-referenced applications are hereby incorporated by reference to provide background information regarding the present invention.

BACKGROUND OF THE INVENTION

1. Field of the Invention

The present invention relates to Field-Effect Transistors (FETs), and, in particular, to a programmable Complementary Metal-Oxide-Semiconductor (CMOS) temperature compensation circuit that is used for adjusting the gate voltage of MOSFETs in order to compensate for variations in temperature.

2. Description of the Related Art

Temperature variations affect the performance of FETs. Temperature variations may be in the form of ambient temperature variations, i.e., variations in the temperature of the air surrounding integrated circuits, and/or junction temperature variations, i.e., variations in the temperature of the silicon in an integrated circuit. Ambient temperature variations can cause junction temperature variations, and vice versa.

FET performance is affected because temperature variations tend to cause the transconductance $g_m$ of the transistors to vary. The amount of current that is conducted by a transistor's current conducting channel, i.e., the current conducted between the drain and source ($I_{DS}$ for n-channel and $I_{SD}$ for p-channel), is determined in part by $g_m$. In the case of a MOSFET, when temperature increases, transconductance $g_m$ decreases which causes currents $I_{DS}$ and $I_{SD}$ to decrease. On the other hand, when temperature decreases, transconductance $g_m$ increases which causes $I_{DS}$ and $I_{SD}$ to increase. Thus, it may be said that the current conducted by the channel of a MOSFET has a negative temperature coefficient. Furthermore, $I_{DS}$, $I_{SD}$, and $g_m$ vary linearly with temperature variations.

Logic gates are typically constructed from several transistors. The speed of a logic gate is determined in part by the $I_{DS}$ of the individual transistors, which results in gate speed being proportional to $g_m$. If the $g_m$ of each transistor in a logic gate varies with temperature, then the $I_{DS}$ of each transistor also varies which causes the speed of the logic gate to vary with temperature. For example, when temperature increases, gate speed decreases, and when temperature decreases, gate speed increases.

Variations in gate speed due to temperature variations is an undesirable characteristic because such variations can adversely affect the synchronized timing operations of a digital system. Digital systems can be designed to operate more efficiently if the designer can be assured that gate speed will remain constant. Gate speed can be kept relatively constant if temperature is kept constant. However, because digital systems must operate in a variety of environments, ambient and junction temperature cannot always be controlled.

Temperature variations also affect the performance of bipolar transistors, and thus, the speed of logic gates constructed from bipolar transistors tends to vary with temperature. FIG. 1 shows a bipolar transistor circuit 10 having prior art circuitry 12 that is used to offset the effects of temperature variations.

The circuitry 12 suffers from a number of disadvantages due to its bipolar construction. First, the emitters of transistors Q23 and Q24A cannot be connected directly to voltage supply $V_{CC}$ because the emitters must be clamped to have a potential equal to three diode voltages. Because it is common for voltage supply $V_{CC}$ to vary, the emitters of transistors Q23 and Q24A must be connected to resistor R34 to absorb any voltage supply $V_{CC}$ variations.

Second, when voltage supply $V_{CC}$ varies, the current through resistor R34 also varies. In order to maintain constant currents through transistors Q23 and Q24A, transistor Q25 is needed to absorb any excess current.

Third, transistor Q22 is needed in order to keep the currents conducted by transistors Q23 and Q24A equal. Transistor Q22, however, has a tendency to cause oscillations in the circuit 12.

Lastly, bipolar transistor circuitry has high power dissipation and high cost large scale integration due to low gate density.

Thus, there is a need for a CMOS circuit that can be used to maintain relatively constant gate speed during variations in temperature.

SUMMARY OF THE INVENTION

The present invention provides a temperature compensation circuit that includes a first field-effect transistor (FET), a second FET, a resistor, and current generating circuitry. The second FET has a larger current conducting channel than the current conducting channel of the first FET, and the gate of the second FET is coupled to the gate of the first FET. The resistor is coupled between a first node that is common with the source of the first FET and a second node that is common with the source of the second FET. The current generating circuitry generates and maintains substantially equal drain currents in the first and second FETs.

In an alternative embodiment, the present invention provides a programmable temperature compensation circuit for adjusting the gate voltages of FETs to compensate for variations in temperature. A positive temperature coefficient current generation stage that includes a first FET causes a first current conducted by the channel of the first FET to increase when temperature increases and decrease when temperature decreases. A programmable current transfer and modification stage generates a third current that may be selectively programmed to be any one of a plurality of values that are linearly proportional to the first current conducted by the channel of the first FET.

A better understanding of the features and advantages of the present invention will be obtained by reference to the following detailed description of the invention and accompanying drawings which set forth an illustrative embodiment in which the principles of the invention are utilized.

DETAILED DESCRIPTION OF THE PREFERRED EMBODIMENTS

A relatively constant logic gate speed can be maintained during ambient and junction temperature variations if the current conducted by the conducting channels of a logic gate's MOSFET transistors is maintained at relatively constant levels despite the temperature variations.

Figure 1:
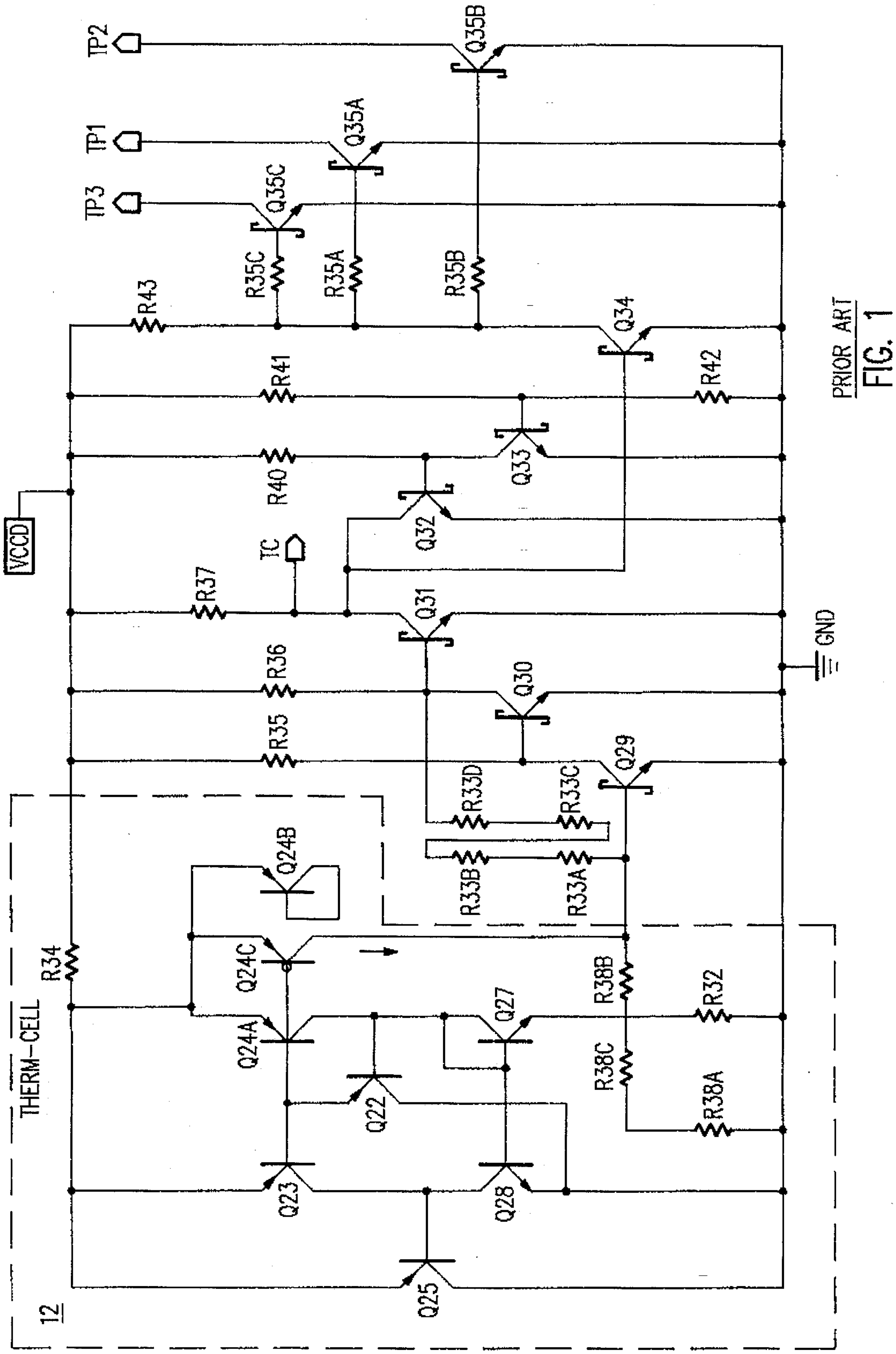
PRIOR ART FIG. 1
FIG. 1 is a schematic diagram of a conventional bipolar circuit that is used to offset the effects of temperature variations.
Figure 2:
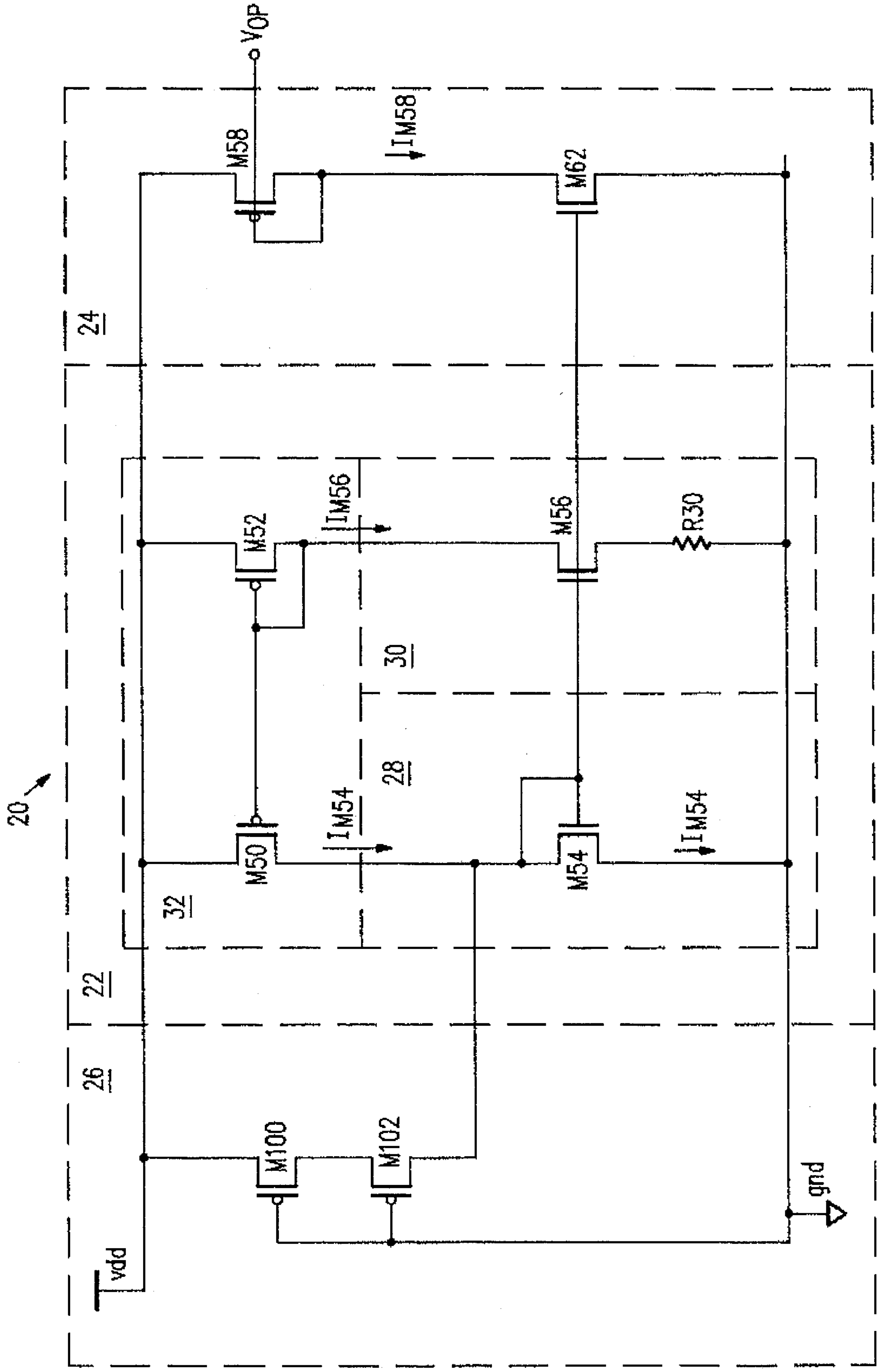
FIG. 2 is a schematic diagram illustrating a CMOS temperature compensation circuit in accordance with the present invention.

FIG. 2 shows a CMOS temperature compensation circuit 20 in accordance with the present invention that is capable of adjusting the generated $I_{SD}$ of an external p-channel MOSFET to compensate for temperature variations. It is assumed herein that an external MOSFET is external to the circuit 20 but is positioned within the same environment as the circuit 20 such that it is subject to substantially the same temperature and variations thereof.

In general, the circuit 20 adjusts the $I_{SD}$ of a MOSFET during variations in temperature by adjusting the MOSFET's gate voltage in response to the temperature variations. In the case of a p-channel MOSFET, when temperature increases, the circuit 20 adjusts the gate voltage of the transistor, via output $V_{op}$, so that the source-gate voltage $V_{SG}$ increases. By increasing $V_{SG}$, more current $I_{SD}$ will be conducted by the transistor's conducting channel which will compensate for the decrease in $I_{SD}$ due to the increase in temperature. On the other hand, when temperature decreases, the circuit 20 adjusts the gate voltage of the transistor so that the source-gate voltage $V_{SG}$ decreases. By decreasing $V_{SG}$, less current $I_{SD}$ will be conducted by the transistor's conducting channel which will compensate for the increase in $I_{SD}$ due to the decrease in temperature.

As will be discussed below with reference to FIG. 3A and 3B, the circuit 20 can be modified to provide an output $V_{on}$ for adjusting the gate voltage of an n-channel MOSFET to compensate for temperature variations. When temperature increases, $V_{on}$ increases $V_{GS}$ which causes more current $I_{DS}$ to be conducted by the transistor's conducting channel. The increase in $I_{DS}$ compensates for the decrease in $I_{DS}$ due to the increase in temperature. On the other hand, when temperature decreases, $V_{on}$ decreases $V_{GS}$ which causes less current $I_{DS}$ to be conducted by the transistor's conducting channel. The decrease in $I_{DS}$ compensates for the increase in $I_{DS}$ due to the decrease in temperature.

The $V_{SG}$ and $V_{GS}$ of the external MOSFETs may be adjusted so that the currents $I_{DS}$ and $I_{SD}$ are maintained at a relatively constant level during temperature variations, or the $V_{SG}$ and $V_{GS}$ of the external MOSFETs may be adjusted so that the currents $I_{DS}$ and $I_{SD}$ actually increase during temperature increases and decrease during temperature decreases. In the later scenario, $V_{SG}$ and $V_{GS}$ are simply increased or decreased slightly more than they would be in the first scenario. Increasing or decreasing the currents $I_{DS}$ and $I_{SD}$ according to the later scenario may be necessary because the external MOSFETs may be interconnected to many other MOSFETs that have no temperature compensation system. Increasing the currents $I_{DS}$ and $I_{SD}$ in response to a temperature increase will tend to compensate the other uncompensated MOSFETs in the circuit.

The temperature compensation circuit 20 includes a positive temperature coefficient current generation stage 22, a current transfer and modification stage 24, and a start-up stage 26.

The current generation stage 22 is an important component of the circuit 20 because it generates a drain-source current $I_{M54}$ in a MOSFET that has a positive temperature coefficient. In other words, when temperature increases, $I_{M54}$ increases, and when temperature decreases, $I_{M54}$ decreases. As discussed above, the current conducted by the channel of a MOSFET normally has a negative temperature coefficient. Because $I_{M54}$ has a positive temperature coefficient, the current transfer and modification stage 24 is able to use $I_{M54}$ to generate the output $V_{op}$ which compensates for temperature variations.

The current generation stage 22 includes an n-channel transistor M54, a monitoring circuit 30, and a current generator 32. In general, the positive temperature coefficient current $I_{M54}$ is generated as follows: The current generator 32 generates and maintains two substantially equal currents $I_{M54}$ and $I_{M56}$ that are provided to the drain of transistor M54 and the monitoring circuit 30, respectively. When the strength of one of these currents changes, the current generator 32 changes the strength of the other current so that the two currents $I_{M54}$ and $I_{M56}$ remain substantially equal. The monitoring circuit 30 monitors the potential difference between the gate and source of transistor M54 and increases the strength of $I_{M56}$ in response to an increase in temperature, and decreases the strength of IM56 in response to a decrease in temperature. Whether $I_{M56}$ is increased or decreased by the monitoring circuit 30, the current generator 32 adjusts $I_{M54}$ so that the two currents remain substantially equal. Thus, IM54 increases when temperature increases and decreases when temperature decreases.

The monitoring circuit 30 includes an n-channel transistor M56 which has its gate coupled to the gate of transistor M54. A resistor R30 is coupled between a first node that is common with the source of transistor M54 and a second node that is common with the source of transistor M56. In the embodiment shown in FIG. 2, the first node is ground.

As indicated in FIG. 2, transistor M56 has a larger current conducting channel than the current conducting channel of transistor M54. Preferably, the channel of transistor M56 has a width of 160 μm (micro-meters) and a length of 2 μm, and the channel of transistor M54 has a width of 40 μm and a length of 2 μm. As will be discussed below, the smaller channel size of transistor M54 results in $V_{GSM54}$ being larger than $V_{GSM56}$ when the channels of transistors M54 and M56 conduct equal currents.

The current generator 32 includes two p-channel transistors M50 and M52 that have their gates coupled together. Transistor M50 has its drain coupled to the drain of transistor M54. Transistor M52 has its drain coupled to its gate and to the drain of transistor M56. The sources of transistors M50 and M52 are coupled to a common node so that the transistors function as a current mirror. In the embodiment shown in FIG. 2, the common node is a supply voltage $V_{DD}$.

As indicated in FIG. 2, transistors M50 and M52 have current conducting channels that are substantially the same size. Preferably, the channels of transistors M50 and M52 have widths of 80 μm and lengths of 2 μm. Furthermore, current $I_{M54}$ flows from the drain of transistor M50, and current $I_{M56}$ flows from the drain of transistor M52.

During operation, the equal currents $I_{M54}$ and $I_{M56}$ generated by the current generator 32 force the currents through transistors M54 and M56 to be equal. Because transistor M54 has a higher current density than transistor M56 (due to transistor M54 having a smaller conducting channel), the $V_{GS}$ of transistor M54, i.e., $V_{GSM54}$, is larger than the $V_{GS}$ of transistor M56, i.e., $V_{GSM56}$.

The drain-source current $I_{DS}$ of a MOSFET is equal to:

$$I_{DS} = \mu Co \frac{W}{L} (V_{GS} - V_{TH})^2$$

where,

W=conducting channel width;

L=conducting channel length;

$V_{TH}$=threshold voltage;

$$\mu(T) \alpha \frac{1}{T^{1.5}} \text{ ; and}$$

T=temperature

From this equation it follows that, if the $I_{DS}$ of a MOSFET is held constant, then $V_{GS}$ will increase when temperature increases, and vice versa. Thus, because the current generator 32 maintains both $I_{M54}$ and $I_{M56}$ at a relatively constant level, $V_{GSM54}$ and $V_{GSM56}$ will both increase when temperature increases and both decrease when temperature decreases. Furthermore, because transistor M54 has a higher current density than transistor M56, the $V_{GSM54}$ will increase or decrease more than the $V_{GSM56}$.

The current through resistor R30 is equal to:

$$I_{R30}=(V_{GSM54}-V_{GSM56})/R30$$

Furthermore, $$I_{R30}=I_{M56}$$

As temperature increases, $V_{GSM54}$ and $V_{GSM56}$ both increase with $V_{GSM54}$ increasing more than $V_{GSM56}$. THUS, the difference between $V_{GSM54}$ and $V_{GSM56}$ increases as temperature increases which causes $I_{R30}$, and thus, $I_{M56}$, to increase. Because transistors M50 and M52 are connected to operate as a current mirror, $I_{M54}$ remains substantially equal to $I_{M56}$. Therefore, as $I_{M56}$ increases with increasing temperature, $I_{M54}$ also increases. Conversely, as $I_{M56}$ decreases with decreasing temperature, $I_{M54}$ also decreases.

Briefly summarizing, the drain-source current $I_{DS}$ of a MOSFET normally has a negative temperature coefficient, i.e., as temperature increases, $I_{DS}$ decreases. However, the drain-source current $I_{M54}$ of transistor M54 has a positive temperature coefficient, i.e., as temperature increases, $I_{M54}$ increases. This phenomenon that occurs in the current generation stage 22 permits the other components of the circuit 20 to provide an output $V_{op}$ to adjust the gate voltage of MOSFETs in order to compensate for variations in temperature.

It should also be noted that the positive temperature coefficient current generation stage 22 is normally not affected by variations in voltage supply $V_{DD}$. Specifically, transistors M50 and M52 operate in the saturation range while conducting currents $I_{M54}$ and $I_{M56}$. If the supply voltage $V_{DD}$ changes, then the source-drain voltages $V_{SD}$ of each transistor M50 and M52 also change because the drains of transistors M54 and M56 are very high impedance. However, the currents $I_{M54}$ and $I_{M56}$ do not change because the transistors M50 and M52 are operating in saturation. Current $I_{M54}$, which has a positive temperature coefficient, is not affected by variations in $V_{DD}$. Therefore, the current generation stage 22 also compenstates for variations in voltage supply $V_{DD}$.

It is envisioned that the n-channel transistors M54 and M56 could be replaced with p-channel transistors, and that the p-channel current generating transistors M50 and M52 could be replaced with n-channel transistors. In this scenario, p-channel transistors M54 and M56 would have different size conducting channels and have their sources coupled to $V_{DD}$, and n-channel transistors M50 and M52 would have equal size conducting channels and have their sources coupled to ground.

The current transfer and modification stage 24 generates a current $I_{M58}$ that is linear proportional to $I_{M54}$. THUS, $I_{M58}$ also has a positive temperature coefficient. $I_{M58}$ is used to generate $V_{op}$.

The current transfer and modification stage 24 includes an n-channel transistor M62 having its gate coupled to the gate of transistor M54 and its source coupled to a node that is common with the source of transistor M54. In the embodiment shown in FIG. 2, the common node is ground. The drain of transistor M62 is coupled to the drain of a p-channel transistor M58 that has its gate coupled to its drain. The source of transistor M58 is coupled to voltage supply $V_{DD}$. The conducting channels of transistor M58 and M62 conduct current $I_{M58}$.

During operation, $V_{GSM62}$ is equal to $V_{GSM54}$ because transistors M62 and M54 form a current mirror. In the embodiment shown in FIG. 2, transistor M62 has a current conducting channel that is the same size as transistor M54's channel, i.e., width=40 μm and length=2 μm. Because these channels are the same size, current $I_{M58}$ is approximately equal to current $I_{M54}$, and therefore, current $I_{M54}$ is "transferred" to current $I_{M58}$.

It should be understood, however, that by adjusting the size of transistor M62's conducting channel, current $I_{M58}$ can be made equal to a fraction or a multiple of $I_{M54}$. Thus, current $I_{M54}$ may be "modified" by adjusting the channel size of transistor M62.

Using the mirror effect and adjusting the channel size of transistor M62 may seem like a complex way to modify $I_{M54}$ because $I_{M54}$ can also be modified by adjusting the value of resistor R30. However, the temperature coefficient of $I_{M56}$ varies with its current level which is a function of the value of R30 and the channel width and length of transistors M54 and M56. Therefore, it is not desirable to adjust $I_{M54}$ by varying R30 because such variation will also change $I_{M54}$'s temperature coefficient.

The gate of transistor M58 is used as the output $V_{op}$. When coupled to the gate of an external p-channel transistor, $V_{op}$ will adjust the gate voltage of the external transistor in order compensate for variations in temperature. Temperature compensation is achieved because current $I_{M58}$ has a positive temperature coefficient due to the current mirror relationship between transistors M54 and M62. When $V_{op}$ is coupled to the gate of an external p-channel transistor that has its source coupled to $V_{DD}$, a current mirror is formed between the external transistor and transistor M58, i.e., $V_{SG}$ of the external transistor and transistor M58 are equal. If the external transistor has a channel size equal to that of M58, i.e., width=20 μm and length=1 μm, then the current conducted by the channel of the external transistor will be equal to $I_{M58}$, and thus, have a positive temperature coefficient.

It should be understood that by varying the channel size of either the external transistor, transistor M58, or both transistors, current IM58 and/or the channel current of the external transistor may be amplified. However, the currents will still be linear proportional to current $I_{M54}$, and thus, will still have a positive temperature coefficient.

The purpose of the start-up stage 26 is to feed current to transistor M54 when the voltage supply $V_{DD}$ initially starts from ground level so that transistor M54's conducting channel can begin to conduct current. The start-up stage 26 includes two p-channel transistors M100 and M102 that have their gates coupled to ground. Transistor M100 has its source coupled to $V_{DD}$ and its drain coupled to the source of transistor M102. The drain of transistor M102 is coupled to the drain of transistor M54.

When voltage supply $V_{DD}$ initially starts from ground level, none of the transistors carry current. As $V_{DD}$ rises, transistor M102 feeds current into the drain of transistor M54. As the channel of transistor M54 begins to conduct current, a voltage drop is induced across the gate and source of transistor M56. Transistor M56 begins to conduct current which causes transistor M52 to begin to conduct current. Due to the current mirror action, transistor M50 also begins to conduct current which feeds back to transistor M54. This positive feedback continues until the current conducted by transistor M56 reaches its final value. Transistors M100 and M102, however, continue to feed current to transistor M54. Another embodiment of the start-up stage 26 will be discussed below with reference to FIG. 3A.

Figure 3A:
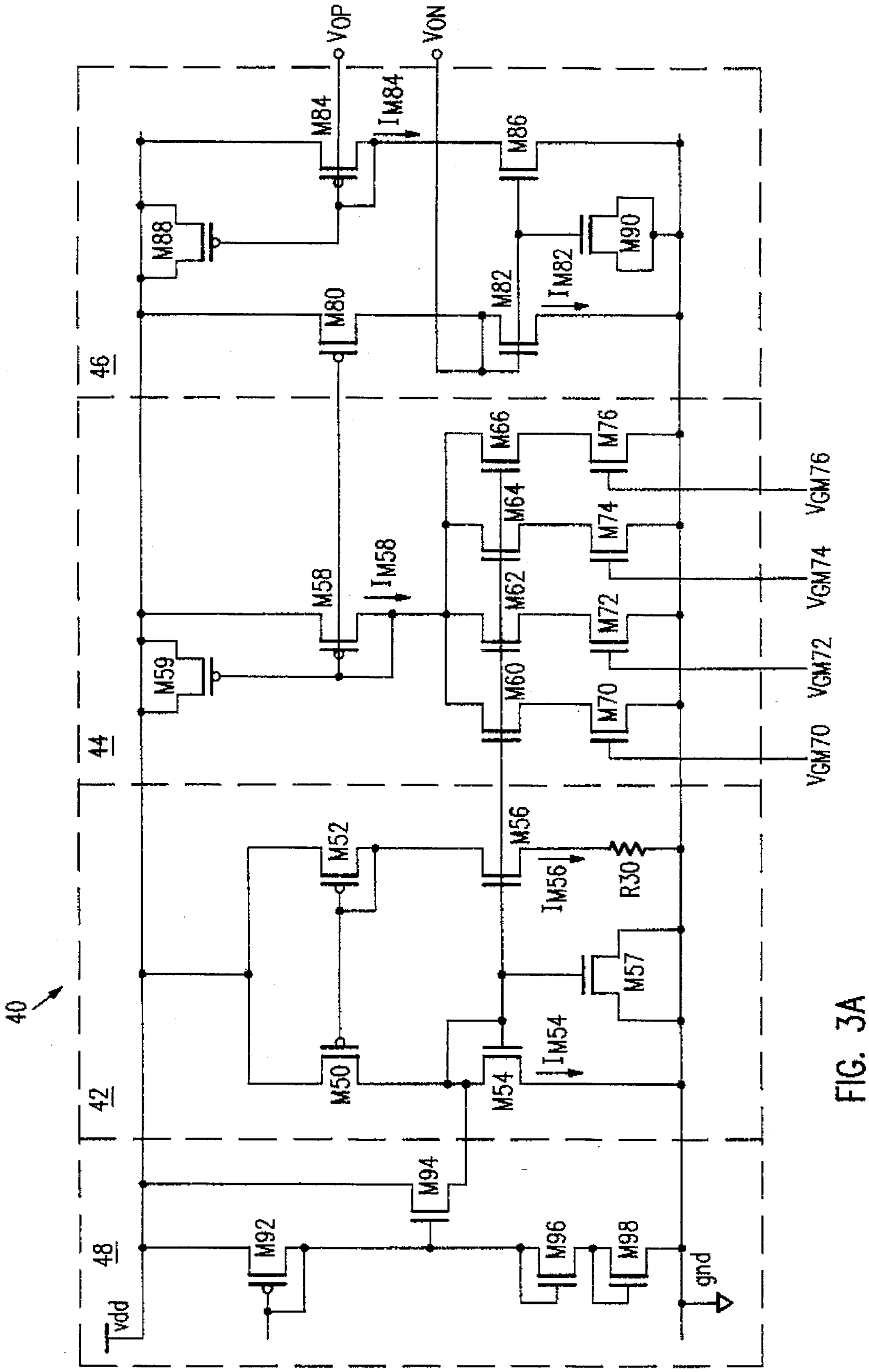
FIGS. 3A and 3B are schematic diagrams illustrating a programmable CMOS temperature compensation circuit in accordance with the present invention.
Figure 3B:
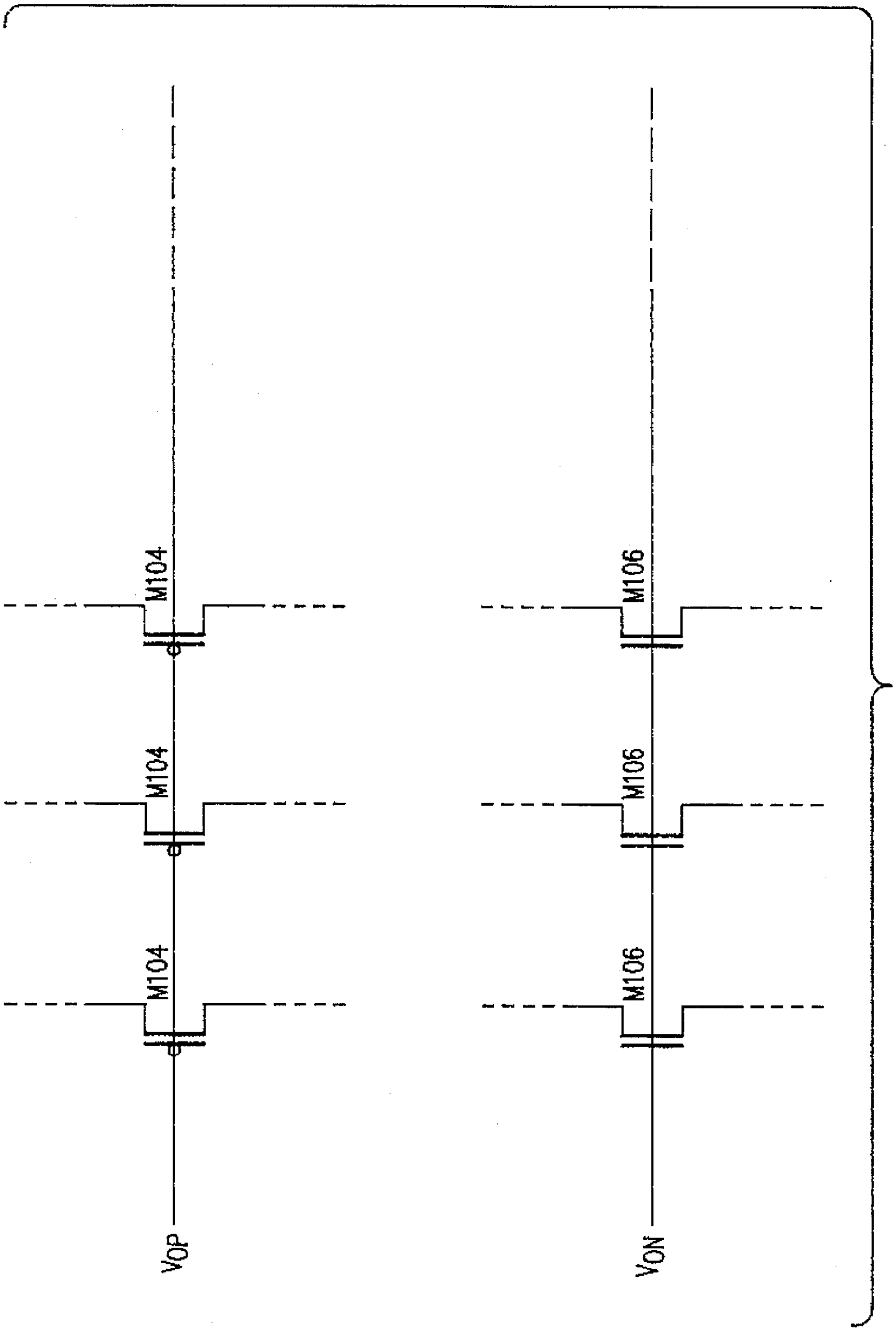

FIGS. 3A and 3B show another embodiment 40 of a MOSFET temperature compensation circuit in accordance with the present invention. The circuit 40 is capable of adjusting the $I_{SD}$ of one or more p-channel MOSFETs M104, via output $V_{op}$, and the $I_{DS}$ of one or more n-channel MOSFETs M106, via output $V_{on}$, during temperature variations.

The temperature compensation circuit 40 includes a positive temperature coefficient current generation stage 42, a programmable current transfer and modification stage 44, an output stage 46, and a start-up stage 48.

The current generation stage 42 is identical to the current generation stage 22 of FIG. 2, except for the addition of an n-channel transistor M57. The purpose of transistor M57, which is optional, is to filter out noise that may be present on the ground line. Transistor M57 is capacitor connected between ground and the gates of transistors M54 and M56, i.e., transistor M57 has its source and drain coupled to ground and its gate coupled to the gates of transistors M54 and M56.

Noise that is present on the ground line will reach the sources of transistors M54 and M56 via their connections to ground. Capacitor connected transistor M57 will let noise pass to the gates of transistors M54 and M56. Because the noise is present at both the gate and source of transistors M54 and M56, the $V_{GS}$ of each transistor should remain relatively constant.

The current transfer and modification stage 44 differs from the current transfer and modification stage 24 in that stage 44 is programmable. Specifically, the current transfer and modification stage 44 generates a current $I_{M58}$ that may be selectively programmed to be any one of several values that are linear proportional to current $I_{M54}$ conducted by the channel of transistor M54. This programmability allows current $I_{M54}$ to be "modified" to have a desired value, and, whatever value is selected, current $I_{M58}$ will have a positive temperature coefficient. Thus, the temperature compensation provided by outputs $V_{op}$ and $V_{on}$ is capable of inducing currents in the external transistors that are a fraction or a multiple of current $I_{M54}$.

As discussed above with respect to the current transfer and modification stage 24, current $I_{M58}$ can be made equal to a fraction or a multiple of $I_{M54}$ by adjusting the size of transistor M62's conducting channel. The programmability feature of the current transfer and modification stage 44 is based on this same principle. Specifically, the current transfer and modification stage 44 includes four n-channel transistors M60, M62, M64, and M66 that each have a different size current conducting channel. Each of the transistors M60, M62, M64, and M66 has its gate coupled to the gate of transistor M54 and its drain coupled to the drain of transistor M58. Furthermore, each of the transistors M60, M62, M64, and M66 forms a current mirror with transistor M54; in other words, the $V_{GS}$ of transistor M54 will be substantially equal to the $V_{GS}$ of each one of the transistors M60, M62, M64, and M66.

The current transfer and modification stage 44 also includes four n-channel transistors M70, M72, M74, and M76 which respectively couple the source of each of the transistors M60, M62, M64, and M66 to ground. The purpose of transistors M70, M72, M74, and M76 is to permit current $I_{M58}$ to be selectively programmed to be conducted by the channel of only one of the transistors M60, M62, M64, and M66 at a time. The gate inputs $V_{GM70}$, $V_{GM72}$, $V_{GM74}$, and $V_{GM76}$, which switch transistors M70, M72, M74, and M76 "on" and "off", respectively, will normally be set such that only one of transistors M60, M62, M64, and M66 conducts current. Transistor M60 conducts current when transistor M70 is "on" transistor M62 conducts current when transistor M72 is "on", and so on.

In the embodiment shown in FIG. 3A, transistor M60 has a channel width=80 μm and a channel length=2 μm, transistor M62 has a channel width=40 μm and a channel length=2 μm, transistor M64 has a channel width=27 μm and a channel length=2 μm, and transistor M66 has a channel width=20 μm and a channel length=2 μm. Furthermore, transistor M70 has a channel width=160 μm and a channel length=2 μm, transistor M72 has a channel width=80 μm and a channel length=2 μm, transistor M74 has a channel width=56 μm and a channel length=2 μm, and transistor M76 has a channel width=40 μm and a channel length=2 μm.

Current $I_{M58}$ will vary according to the "on/off" status of transistors M70, M72, M74, and M76; e.g., when IM58 is conducted through transistor M60, $I_{M58}$ will be twice as large as $I_{M54}$ because transistor M60's channel is twice as large as transistor M54's channel; when $I_{M58}$ is conducted through transistor M62, $I_{M58}$ will be equal to $I_{M54}$ because transistor M62's channel is the same size as transistor M54's channel. Thus:

| | |
|---|---|
| $I_{M58} = 2\ I_{M54}$ | when M70 is ON |
| $= 1\ I_{M54}$ | when M72 is ON |
| $= 0.67\ I_{M54}$ | when M74 is ON |
| $= 0.5\ I_{M54}$ | when M76 is ON |

By selectively programming the inputs $V_{GM70}$, $V_{GM72}$, $V_{GM74}$, and $V_{GM76}$, current $I_{M54}$ is "transferred" to current $I_{M58}$ and "modified" to be a fraction or multiple of $I_{M54}$. The inputs $V_{GM70}$, $V_{GM72}$, $V_{GM74}$, and $V_{GM76}$ are controlled by logic circuitry which will be discussed below with reference to FIGS. 4A and 4B.

It should be noted that, because transistors M70, M72, M74, and M76 each have a channel size that is twice as large as their respective transistors M60, M62, M64, and M66, the presence of transistors M70, M72, M74, and M76 does not significantly affect the current mirror relationship between transistor M54 and transistors M60, M62, M64, and M66.

The transfer and modification stage 44 also includes an optional capacitor connected p-channel transistor M59 that is coupled between $V_{DD}$ and the gate of transistor M58 in order to filter out noise that may be present in the $V_{DD}$ line. Specifically, transistor M59's source and drain are coupled to $V_{DD}$ and its gate is coupled to the gate of transistor M58.

The output stage 46 is coupled to the gate of transistor M58. The purpose of the output stage 46 is to generate two currents, $I_{M82}$ and $I_{M84}$, that are linear proportional to current $I_{M58}$. Current $I_{M82}$ is used to generate output voltage $V_{on}$ for application to the gates of n-channel MOSFETs to compensate for variations in temperature, and current $I_{M84}$ is used to generate output voltage $V_{op}$ for application to the gates of p-channel MOSFETs to compensate for variations in temperature.

A p-channel transistor M80 has its source coupled to $V_{DD}$, its gate coupled to the gate of transistor M58, and its drain coupled to the drain of an n-channel transistor M82. Transistor M82 has its gate is coupled to its drain and its source coupled to ground. The channels of transistors M80 and M82 conduct current $I_{M82}$, and the gate of transistor M82 provides output $V_{on}$.

Transistor M80 forms a current mirror with transistor M58; thus, the $V_{GS}$ of the two transistors will be substantially equal. Current $I_{M82}$ will be linear proportional to current $I_{M58}$ and have a positive temperature coefficient. The value of $I_{M82}$ will depend on the channel size of transistor M80. In the embodiment shown in FIG. 3A, transistor M80 has a channel width=50 μm and a channel length=1 μm, and transistor M82 has a channel width=10 μm and a channel length=1 μm. Because transistor M80 has a larger channel than transistor M58, current $I_{M82}$ will be larger than current $I_{M58}$. It should be understood, however, that by adjusting the channel size of transistor M80, the strength of $I_{M82}$ can be adjusted, and by adjusting the channel size of transistor M82, the output voltage $V_{on}$, which is equal to $V_{GSM82}$, can be adjusted.

By connecting output $V_{on}$ to the gate of an external n-channel transistor that has its source coupled to ground, a current mirror is formed between transistor M82 and the external transistor. Thus, the current conducted by the channel of the external transistor will be linear proportional to $I_{M82}$ and have a positive temperature coefficient and be compensated for supply voltage $V_{DD}$ variations.

A p-channel transistor M84 has its source coupled to $V_{DD}$, its gate coupled to its drain, and its drain coupled to the drain of an n-channel transistor M86. Transistor M86 has its source coupled to ground and its gate coupled to the gate of transistor M82. The channels of transistors M84 and M86 conduct current $I_{M84}$, and the gate of transistor M84 provides output $V_{op}$.

Transistor M86 forms a current mirror with transistor M82; thus, the $V_{GS}$ of the two transistors will be substantially equal. Current $I_{M84}$ will be linear proportional to currents $I_{M82}$ and $I_{M58}$, and have a positive temperature coefficient. The value of $I_{M84}$ will depend on the channel size of transistor M86. In the embodiment shown in FIG. 3A, transistor M86 has a channel width=26 μm and a channel length=1 μm, and transistor M84 has a channel width=80 μm and a channel length=1 μm. Because transistor M86 has a larger channel than transistor M82, current $I_{M84}$ will be larger than current $I_{M82}$. It should be understood, however, that by adjusting the channel size of transistor M86, the strength of $I_{M84}$ can be adjusted, and by adjusting the channel size of transistor M84, the output voltage $V_{op}$, which is equal to $V_{SGM84}$, can be adjusted.

By connecting output $V_{op}$ to the gate of an external p-channel transistor that has its source coupled to $V_{DD}$, a current mirror is formed between transistor M84 and the external transistor. Thus, the current conducted by the channel of the external transistor will be linear proportional to $I_{M84}$ and have a positive temperature coefficient and be compensated for supply voltage $V_{DD}$ variations.

Optional capacitor connected p-channel transistor M88 and n-channel transistor M90 filter noise that may be present on the $V_{DD}$ and ground lines, respectively. Transistor M88 has its source and drain coupled to $V_{DD}$ and its gate coupled to the gate of transistor M84. Transistor M90 has its source and drain coupled to ground and its gate coupled to the gates of transistors M82 and M86.

The start-up stage 48 serves the same purpose as the start-up stage 26 shown in FIG. 2, i.e., to feed current to transistor M54 when the voltage supply $V_{DD}$ initially starts from ground level so that transistor M54's conducting channel can begin to conduct current. However, the start-up stage 48 has a different design with certain advantages over the start-up stage 26. The main advantage of the start-up stage 48 over the start-up stage 26 is that, when $I_{M56}$ reaches its final value, the start-up stage 48 stops feeding current to transistor M54.

The start-up stage 48 includes an n-channel transistor M94 that has its drain coupled to $V_{DD}$ and its source coupled to the drain of transistor M54. A diode connected p-channel transistor M92 is coupled between $V_{DD}$ and the gate of transistor M94, and two diode connected n-channel transistors M96 and M98 couple the gate of transistor M94 to ground. In the embodiment shown in FIG. 3A, transistor M94 has a channel width=5 μm and a channel length=2 μm, transistor M92 has a channel width=3 μm and a channel length=100 μm, and transistors M96 and M98 have channel widths=60 μm and channel lengths=2 μm. The channel sizes of transistors M92, M94, M96, and M98 may be varied to suit the needs of a particular application.

When voltage supply $V_{DD}$ initially starts from ground level, none of the transistors carry current. When $V_{DD}$ rises above three times the threshold voltage, i.e., 3 $V_{TH}$, of transistor M94, transistor M94 feeds current into the drain of transistor M54. Current is fed back to transistor M54 in the manner described above with respect to the start-up stage 26 until the current conducted by transistor M56 reaches its final value. Because the gate of transistor M94 is clamped by diode connected transistors M96 and M98, the rise of the drain potential of transistor M54 eventually shuts off transistor M94. By shutting off transistor M94, the current IM54 is not affected by the start-up stage 48; this was not the case with the start-up stage 26.

Figures 4A, 4B:
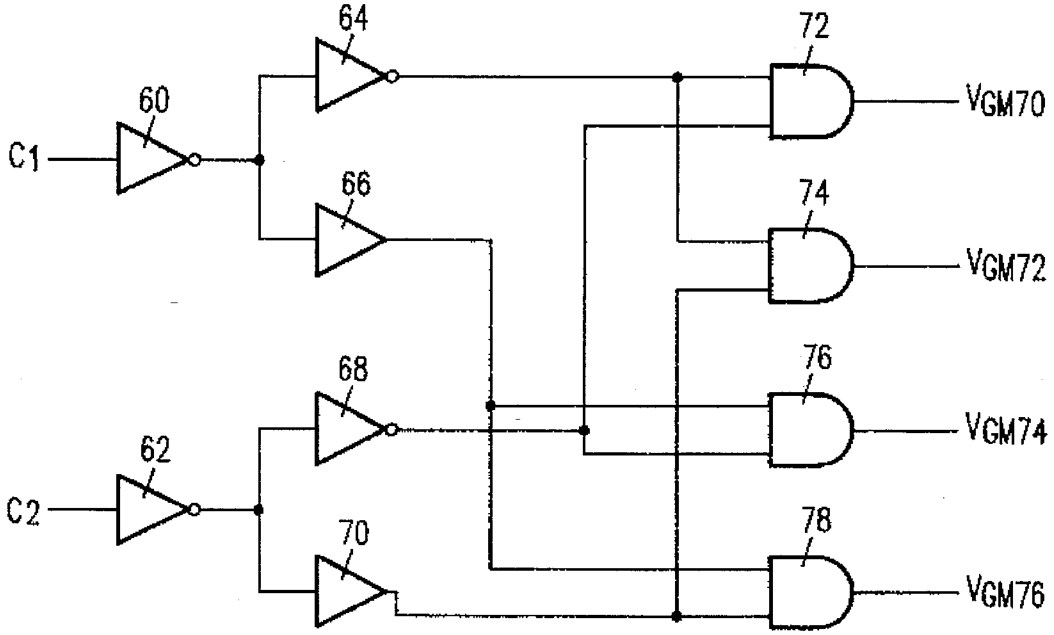
FIG. 4A is a schematic diagram illustrating control logic circuitry that is used for programming the temperature compensation circuit shown in FIG. 3A.
FIG. 4B is a truth table for the control logic circuitry shown in FIG. 4A.

FIG. 4A shows the control logic circuitry for programming transistors M70, M72, M74, and M76 so that only one of transistors M60, M62, M64, and M66 conducts current $I_{M58}$ at a time. The control logic includes two inverters 60 and 62 that receive at their inputs control signals C1 and C2, respectively. The output of inverter 60 is coupled to the input of an inverter 64 and the input of a buffer 66, and the output of inverter 62 is coupled to the input of an inverter 68 and the input of a buffer 70.

Four AND gates 72, 74, 76, and 78 receive the outputs of inverters 64 and 68 and buffers 66 and 70. Specifically, AND gate 72 receives the outputs of inverters 64 and 68, AND gate 74 receives the outputs of inverter 64 and buffer 70, AND gate 76 receives the outputs of buffer 66 and inverter 68, and AND gate 78 receives the outputs of buffers 66 and 70. AND gates 72, 74, 76, and 78 have their outputs $V_{GM70}$, $V_{GM72}$, $V_{GM74}$, and $V_{GM76}$ coupled to the gates of transistors M70, M72, M74, and M76, respectively.

FIG. 4B shows a truth table for the logic circuit of FIG. 4A. For each combination of control signals C1 and C2, only one of the outputs $V_{GM70}$, $V_{GM72}$, $V_{GM74}$, and $V_{GM76}$ will be logic "1" at a time.

It should be understood that the programmability feature of the current transfer and modification stage 24 that is implemented by the use of the several transistors M60, M62, M64, M66, M70, M72, M74, and M76, as well as the control logic circuitry shown in FIG. 4A, is optional. As discussed above with respect to the current transfer and modification stage 24, current $I_{M54}$ may be modified, i.e., amplified, by substituting for transistor M62 various transistors that have various different channel sizes.

In addition, it should be well understood that the specific channel sizes of the MOSFETs shown in FIGS. 2 and 3 and recited herein may be adjusted to achieve various different amplifications of the generated currents and voltages.

Although the embodiment of the present invention shown in FIGS. 2 and 3 utilizes MOSFETs, it is envisioned that the present invention may also be used in connection with other technologies, such as junction FETs (JFETs) or Gallium Arsenide (GaAs).

It should be understood that various alternatives to the embodiments of the invention described herein may be employed in practicing the invention. It is intended that the following claims define the scope of the invention and that structures and methods within the scope of these claims and their equivalents be covered thereby.

What is claimed is:

1. A temperature compensation circuit, comprising:

a first field-effect transistor (FET) having a source, a drain, a gate, and a current conducting channel inducible between its source and its drain;

a second FET having a source, a drain, a gate, and a current conducting channel inducible between its source and its drain, the current conducting channel of the second FET being larger than the current conducting channel of the first FET, the second FET having its gate coupled to the gate of the first FET;

a resistor having first and second terminals, the first terminal of the resistor being connected to a first node that is common with the source of the first FET and the second terminal of the resistor being connected to a second node that is common with the source of the second FET; and current generating circuitry for generating a first current in the current conducting channel of the first FET and a second current in the current conducting channel of the second FET and for maintaining the first current to be substantially equal to the second current.

2. A temperature compensation circuit according to claim 1, wherein the current generating circuitry comprises:

a third FET having a source, a drain, a gate, and a current conducting channel inducible between its source and its drain, the third FET having its drain coupled to the drain of the first FET; and a fourth FET having a source, a drain, a gate, and a current conducting channel inducible between its source and its drain, the current conducting channel of the fourth FET being substantially equal in size to the current conducting channel of the third FET, the fourth FET having its gate coupled to the gate of the third FET and the fourth FET having its drain coupled to the drain of the second FET, the sources of the third and fourth FETs being coupled to a common node so that the third and fourth FETs function as a current mirror.

3. A temperature compensation circuit, comprising:

a first field-effect transistor (FET) having a source, a drain, a gate, and a current conducting channel inducible between its source and its drain;

a second FET having a source, a drain, a gate, and a current conducting channel inducible between its source and its drain, the current conducting channel of the second FET being larger than the current conducting channel of the first FET, the second FET having its gate coupled to the gate of the first FET;

a resistor coupled between a first node that is common with the source of the first FET and a second node that is common with the source of the second FET;

current generating circuitry for generating a first current in the current conducting channel of the first FET and a second current in the current conducting channel of the second FET and for maintaining the first current to be substantially equal to the second current;

a third FET having a source, a drain, a gate, and a current conducting channel inducible between its source and its drain, the third FET having its gate connected to a third node that is common with the gate of the first FET and the source of the third FET being coupled to the first node that is common with the source of the first FET; and wherein, the current conducting channel of the third FET conducts a third current that is linearly proportional to the first current conducted by the current conducting channel of the first FET.

4. A temperature compensation circuit according to claim 3, further comprising:

a fourth FET having a source, a drain, a gate, and a current conducting channel inducible between its source and its drain, the fourth FET having its gate coupled to its drain and its drain coupled to the drain of the third FET; and wherein, the current conducting channel of the fourth FET conducts the third current.

5. A temperature compensation circuit, comprising:

a first field-effect transistor (FET) having a source, a drain, a gate, and a current conducting channel inducible between its source and its drain;

a second FET having a source, a drain, a gate, and a current conducting channel inducible between its source and its drain, the current conducting channel of the second FET being larger than the current conducting channel of the first FET, the second FET having its gate coupled to the gate of the first FET;

a resistor coupled between a first node that is common with the source of the first FET and a second node that is common with the source of the second FET;

current generating circuitry for generating a first current in the current conducting channel of the first FET and a second current in the current conducting channel of the second FET and for maintaining the first current to be substantially equal to the second current; and programmable current transfer and modification circuitry for generating a third current that may be selectively programmed to be any one of a plurality of values that are linear proportional to the first current conducted by the current conducting channel of the first FET.

6. A temperature compensation circuit according to claim 5, wherein the programmable current transfer and modification circuitry comprises:

a first plurality of FETs, each has a source, a drain, a gate, and a current conducting channel inducible between its source and its drain, the gates of the first plurality of FETs being coupled to the gate of the first FET, each of the current conducting channels of the first plurality of FETs having a different size;

a third FET having a source, a drain, a gate, and a current conducting channel inducible between its source and its drain, the third FET having its gate coupled to its drain and its drain coupled to the drains of the first plurality of FETs; and wherein, one of the current conducting channels of the first plurality of FETs and the current conducting channel of the third FET conduct the third current.

7. A temperature compensation circuit according to claim 6, wherein the programmable current transfer and modification circuitry further comprises:

a second plurality of FETs which couple the sources of the first plurality of FETs to the first node that is common with the source of the first FET so that the third current may be selectively programmed to be conducted by any one of the current conducting channels of the first plurality of FETs.

8. A temperature compensation circuit according to claim 7, wherein the programmable current transfer and modification circuitry further comprises:

control logic means for programming the second plurality of FETs so that only one FET in the second plurality of FETs is switched on at a time.

9. A programmable temperature compensation circuit for adjusting gate voltages of field-effect transistors (FETs) to compensate for variations in temperature, comprising:

a positive temperature coefficient current generation stage that includes a resistor, a first FET, and a second FET, the first and second FETs each having a source, a drain, a gate, a current conducting channel, and a gate-source voltage measured between the gate and source, the current conducting channels of the first and second FETs being different sizes and the resistor and the first and second FETs being connected together so that a voltage across the resistor is equal to a difference between the gate-source voltages of the first and second FETs so that a first current conducted by the resistor increases when temperature increases and decreases when temperature decreases; and a programmable current transfer and modification stage for generating a second current that may be selectively programmed to be any one of a plurality of values that are linearly proportional to the first current conducted by the resistor.

10. A programmable temperature compensation circuit according to claim 9, further comprising:

an output stage which generates third and fourth currents that are linearly proportional to the second current, the third current being used to generate a first output voltage for application to gates of n-channel FETs to compensate for variations in temperature, and the fourth current being used to generate a second output voltage for application to gates of p-channel FETs to compensate for variations in temperature.

11. A programmable temperature compensation circuit according to claim 9, further comprising:

a start-up stage that includes an eleventh FET for feeding current to the first FET so that its conducting channel can begin to conduct current.

12. A programmable temperature compensation circuit for adjusting gate voltages of field-effect transistors (FETs) to compensate for variations in temperature, comprising:

a positive temperature coefficient current generation stage that includes a first FET having a source, a drain, a gate, and a current conducting channel inducible between its source and its drain, the positive temperature coefficient current generation stage causing a first current conducted by the current conducting channel of the first FET to increase when temperature increases and decrease when temperature decreases; and a programmable current transfer and modification stage for generating a second current that may be selectively programmed to be any one of a plurality of values that are linearly proportional to the first current conducted by the current conducting channel of the first FET;

wherein the positive temperature coefficient current generation stage includes:

a second FET having a source, a drain, a gate, and a current conducting channel inducible between its source and its drain, the current conducting channel of the second FET being larger than the current conducting channel of the first FET, the second FET having its gate coupled to the gate of the first FET;

a resistor coupled between a first node that is common with the source of the first FET and a second node that is common with the source of the second FET; and current generating circuitry for generating the first current in the current conducting channel of the first FET and a third current in the current conducting channel of the second FET and for maintaining the first current to be substantially equal to the third current.

13. A programmable temperature compensation circuit according to claim 12, wherein the current generating circuitry comprises:

a third FET having a source, a drain, a gate, and a current conducting channel inducible between its source and its drain, the third FET having its drain coupled to the drain of the first FET; and a fourth FET having a source, a drain, a gate, and a current conducting channel inducible between its source and its drain, the current conducting channel of the fourth FET being substantially equal in size to the current conducting channel of the third FET, the fourth FET having its gate coupled to the gate of the third FET and the fourth FET having its drain coupled to the drain of the second FET, the sources of the third and fourth FETs being coupled to a common node so that the third and fourth FETs function as a current mirror.

14. A programmable temperature compensation circuit for adjusting gate voltages of field-effect transistors (FETs) to compensate for variations in temperature, comprising:

a positive temperature coefficient current generation stage that includes a first FET having a source, a drain, a gate, and a current conducting channel inducible between its source and its drain, the positive temperature coefficient current generation stage causing a first current conducted by the current conducting channel of the first FET to increase when temperature increases and decrease when temperature decreases; and a programmable current transfer and modification stage for generating a second current that may be selectively programmed to be any one of a plurality of values that are linearly proportional to the first current conducted by the current conducting channel of the first FET;

wherein the programmable current transfer and modification stage includes:

a first plurality of FETs, each has a source, a drain, a gate, and a current conducting channel inducible between its source and its drain, the gates of the first plurality of FETs being coupled to the gate of the first FET, each of the current conducting channels of the first plurality of FETs having a different size;

a second FET having a source, a drain, a gate, and a current conducting channel inducible between its source and its drain, the second FET having its gate coupled to its drain and its drain coupled to the drains of the first plurality of FETs; and wherein, one of the current conducting channels of the first plurality of FETs and the current conducting channel of the second FET conduct the second current.

15. A programmable temperature compensation circuit according to claim 14, wherein the programmable current transfer and modification stage further comprises:

a second plurality of FETs which couple the sources of the first plurality of FETs to a first node that is common with the source of the first FET so that the second current may be selectively programmed to be conducted by any one of the current conducting channels of the first plurality of FETs.

16. A programmable temperature compensation circuit according to claim 15, wherein the programmable current transfer and modification means further comprises:

control logic means for programming the second plurality of FETs so that only one FET in the second plurality of FETs is switched on at a time.

17. A programmable temperature compensation circuit for adjusting gate voltages of field-effect transistors (FETs) to compensate for variations in temperature, comprising:

a positive temperature coefficient current generation stage that includes a first FET having a source, a drain, a gate, and a current conducting channel inducible between its source and its drain, the positive temperature coefficient current generation stage causing a first current conducted by the current conducting channel of the first FET to increase when temperature increases and decrease when temperature decreases;

a programmable current transfer and modification stage for generating a second current that may be selectively programmed to be any one of a plurality of values that are linearly proportional to the first current conducted by the current conducting channel of the first FET; and an output stage which generates third and fourth currents that are linearly proportional to the second current, the third current being used to generate a first output voltage for application to gates of n-channel FETs to compensate for variations in temperature, and the fourth current being used to generate a second output voltage for application to gates of p-channel FETs to compensate for variations in temperature;

wherein the output stage includes:

a first p-channel FET having a source, a drain, a gate, and a current conducting channel inducible between its source and its drain which conducts the third current, the first p-channel FET having its source coupled to a positive supply voltage;

a first n-channel FET having a source, a drain, a gate, and a current conducting channel inducible between its source and its drain which also conducts the third current and the gate of which generates the first output voltage, the first n-channel FET having its drain coupled to its gate and to the drain of the first p-channel FET, and the first n-channel FET having its source coupled to ground;

a second p-channel FET having a source, a drain, a gate, and a current conducting channel inducible between its source and its drain which conducts the fourth current and the gate of which generates the second output voltage, the second p-channel FET having its gate coupled to its drain and its source coupled to a positive supply voltage; and a second n-channel FET having a source, a drain, a gate, and a current conducting channel inducible between its source and its drain which also conducts the fourth current, the second n-channel FET having its drain coupled to the drain of the second p-channel FET, its gate coupled the gate of the first n-channel FET, and its source coupled to ground.

* * * * *